(12) United States Patent
Oishi et al.

(10) Patent No.: US 8,642,181 B2
(45) Date of Patent: Feb. 4, 2014

(54) METAL-CLAD WHITE LAMINATE

(75) Inventors: Jitsuo Oishi, Kanagawa (JP); Shuta Kihara, Kanagawa (JP); Ko Kedo, Tokyo (JP); Takakiyo Mine, Kanagawa (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 740 days.

(21) Appl. No.: 11/574,165

(22) PCT Filed: Aug. 19, 2005

(86) PCT No.: PCT/JP2005/015170
§ 371 (c)(1),
(2), (4) Date: Feb. 23, 2007

(87) PCT Pub. No.: WO2006/022207
PCT Pub. Date: Mar. 2, 2006

(65) Prior Publication Data
US 2007/0292709 A1 Dec. 20, 2007

(30) Foreign Application Priority Data

Aug. 23, 2004 (JP) ................................. 2004-241904
Sep. 17, 2004 (JP) ................................. 2004-270945

(51) Int. Cl.
*B32B 15/08* (2006.01)
*B32B 9/00* (2006.01)

(52) U.S. Cl.
USPC ............................ 428/458; 428/384; 428/391

(58) Field of Classification Search
USPC ......................................... 428/458, 384, 391
See application file for complete search history.

(56) References Cited

U.S. PATENT DOCUMENTS

| 4,133,908 | A | * | 1/1979 | Madsen | 430/413 |
|---|---|---|---|---|---|
| 5,262,505 | A | | 11/1993 | Nakashima et al. | |
| 5,977,019 | A | | 11/1999 | Ozeki et al. | |
| 6,121,988 | A | * | 9/2000 | Uchiyama | 347/208 |
| 6,949,772 | B2 | * | 9/2005 | Shimizu et al. | 257/99 |
| 6,962,756 | B2 | * | 11/2005 | Kihara et al. | 428/690 |
| 2003/0104232 | A1 | | 6/2003 | Kihara et al. | |
| 2004/0180988 | A1 | * | 9/2004 | Bernius et al. | 523/160 |
| 2005/0158687 | A1 | * | 7/2005 | Dahm | 433/29 |
| 2005/0272857 | A1 | * | 12/2005 | Kawato et al. | 524/497 |

FOREIGN PATENT DOCUMENTS

| CN | 1417809 | | 5/2003 |
|---|---|---|---|
| JP | 02-099978 | | 4/1990 |
| JP | 02-208324 | | 8/1990 |
| JP | 04014441 A | * | 1/1992 |
| JP | 10-202789 | | 8/1998 |
| JP | 2001002417 | * | 1/2001 |
| JP | 2003-060321 | | 2/2003 |
| WO | 2004/044044 | * | 5/2004 |
| WO | 2004-044044 | * | 5/2004 |

OTHER PUBLICATIONS

Chinese Official Action dated Nov. 21, 2008, for Application No. 200580027970.X (translation only).

* cited by examiner

*Primary Examiner* — Kevin R Kruer
(74) *Attorney, Agent, or Firm* — Antonelli, Terry, Stout & Kraus, LLP.

(57) ABSTRACT

The present invention provides a metal-clad white laminate including: a white resin layer which is composed of a resin composition obtained by mixing a polyimide having a repeating unit as represented by a particular chemical structural formula with a white pigment; and at least one metal layer, the white resin layer being an adhesive layer for the metal layer. The metal-clad white laminate of the present invention uses a white resin composition which has high reflectance and whiteness and excellent light resistance, and is easy to be reduced in thickness and weight.

14 Claims, No Drawings

METAL-CLAD WHITE LAMINATE

TECHNICAL FIELD

The present invention relates to a metal-clad white laminate using a white resin composition containing polyimide and a white pigment. The metal-clad white laminate is preferably used for a flexible printed wiring board on which a light emitting diode (hereinafter, sometimes referred to as "LED") is mounted.

BACKGROUND ART

Conventionally, for printed wiring boards which are used for mounting of an LED, there have mainly been used rigid metal-clad laminate plates each of which is obtained by subjecting a prepreg which is composed of a sheet-like glass substrate impregnated with a thermosetting resin containing a white pigment to hot-press molding with a metal foil.

Currently, attempts to decrease a thickness and weight of electronic instruments are made for improving portability and appearance of the instruments. In response thereto, chip LEDs are mainly used as light emitting devices for the instruments. However, the chip LEDs are required for reduction in weight and thickness thereof. In addition, substrates having large reflectance and high whiteness are demanded as substrates for white chip LEDs which are used as backlights for a liquid crystal display (LCD) or the like.

However, there have been limits to the reduction in weight and thickness of the conventional rigid metal-clad laminate plates (see, Patent Documents 1 to 3).

Under those circumstances, there is a demand for adhesives and adhesive films having an excellent heat resistance. For example, there is disclosed a method of forming a thermocompression bonding adhesive layer on an insulating substrate by applying a polyimide or polyamic acid dispersion as the adhesive onto the substrate and then removing the solvent, followed by, if required, imidation (see, Patent Documents 4 and 5). In addition, there is disclosed a method of forming a thermocompression bonding adhesive film by applying a polyimide or polyamic acid dispersion onto a glass plate or the like and then removing the solvent, followed by, if required, imidation. To the thus-formed adhesive layer or adhesive film, an adherend such as a metal layer is thermocompression bonded (see, Patent Documents 4 to 6).

For those adhesives and adhesive films having an excellent heat resistance, there are widely used dispersions or films each of which is composed of an aromatic polyimide or an aromatic polyamic acid which is obtained by subjecting an aromatic tetracarboxylic dianhydride and an aromatic diamine to a polymerization condensation reaction. However, although the above-mentioned aromatic polyimide resins have excellent heat resistance and mechanical properties, they absorb a wide spectrum of visible light, resulting in coloration of pale yellow to red-brown. Thus, a resin composition obtained by mixing the aromatic polyimide resin with a white pigment has low reflectance and low whiteness. Therefore, a flexible metal-clad laminate using the resin composition as an adhesive layer has had a problem in that LEDs which are mounted on the laminate exhibit reduced brightness, which is not practical.

It is known that charge transfer between a tetracarboxylic dianhydride moiety and a diamine moiety is suppressed when an aliphatic monomer is used for the monomer constituting a polyimide, resulting in suppression of coloration (see, Non-patent Document 1). Polyimides using the aliphatic monomer are widely utilized for liquid crystal orientation films because of their characteristics, that is, transparency and heat resistance (see, Patent Document 7). However, there has been no report on a flexible metal-clad laminate on which an LED is intended to be mounted, which uses, as an adhesive layer, a resin composition obtained by mixing a polyimide using an aliphatic monomer with a white pigment.

Patent Document 1: Japanese Patent Application Laid-Open No. 2003-60321
Patent Document 2: Japanese Patent Application Laid-Open No. 2003-152295
Patent Document 3: Japanese Patent Application Laid-Open No. Hei 10-202789
Patent Document 4: Japanese Patent No. 2943953
Patent Document 5: Japanese Patent No. 3014526
Patent Document 6: Japanese Patent No. 3213079
Patent Document 7: Japanese Patent Application Laid-Open No. 2001-228481
Non-patent Document 1: "Novel Polyimides: Basics and Applications" edited by Japan Polyimide Conference, NTS Inc., 2002, p. 387-407

DISCLOSURE OF THE INVENTION

Problem to be Solved by the Invention

It is an object of the present invention to solve the problems of a material which has conventionally been used for insulating layers of printed wiring boards on which LEDs are mounted. Another object of the present invention is to provide a flexible metal-clad laminate which is easy to decrease thickness and weight thereof, using a white resin composition having high reflectance and whiteness and an excellent light resistance.

Means for Solving the Problems

The inventors of the present invention have made extensive studies to achieve the above-mentioned objects. As a result, the inventors of the present invention have found that: a resin composition obtained by mixing a polyimide having a repeating unit of an aliphatic tetracarboxylic acid structure with a white pigment has high reflectance and whiteness and an excellent light resistance; and a flexible metal-clad white laminate in which it is easy to reduce thickness and weight can be obtained by using the resin composition, thus completing the present invention.

That is, the present invention provides a metal-clad white laminate, comprising: a white resin layer composed of a resin composition which is obtained by mixing a polyimide having a repeating unit as represented by the general formula I with a white pigment:

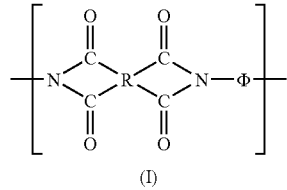

(I)

wherein, R represents a tetravalent aliphatic group which is derived from a cyclic hydrocarbon, an acyclic hydrocarbon, or a hydrocarbon having a cyclic structure and an acyclic structure; Φ represents a structural unit having 2 to 39 carbon atoms, the structural unit being an aliphatic structural unit, an alicyclic structural unit, an aromatic structural unit, an organosiloxane structural unit, or a structural unit of combination or repetition of those units; and Φ may have a main chain in which at least one partial structure selected from the group consisting of —O—, —SO$_2$—, —CO—, —CH$_2$—, —C(CH$_3$)$_2$—, —C$_2$H$_4$O—, and —S— intervenes therein; and at least one metal layer, the white resin layer being an adhesive layer for the metal layer.

In the present invention, there is provided a metal-clad white laminate, in which: R in the general formula I is a tetravalent group derived from a cyclohexane; the white pigment is preferably at least one kind selected from the group consisting of titanium oxide, zirconium oxide, calcium oxide, silicon oxide, zinc oxide, aluminum oxide, zinc sulfide, calcium sulfate, barium sulfate, lead carbonate, lead hydroxide, basic zinc molybdate, basic calcium zinc molybdate, lead white, molybdenum white, and lithopone; more preferably, the white pigment is rutile titanium oxide having a surface on which a coating layer is formed; further more preferably, the coating layer on the titanium oxide is obtained by being subjected to SiO$_2$ or Al$_2$O$_3$ treatment; and particularly preferably, the coating layer on the titanium oxide is obtained by being subjected to polyol or siloxane treatment after the SiO$_2$ or Al$_2$O$_3$ treatment.

The white pigment has a content of preferably 10 to 70% by weight, and more preferably 20 to 50% by weight in the resin composition, and the resin composition layer preferably has a whiteness of 70 or more. In addition, it is preferable that the white resin layer which is exposed by removing a metal layer have a whiteness of 60 or more after the white resin layer is irradiated with a blue light beam having a wavelength spectrum of 400 nm to 480 nm with a wavelength peak at 420 nm in air in a light strength of 90 W/m$^2$ per unit area of the white resin layer for continuously 1,000 hours.

It is preferable that the white resin layer of the present invention is a flexible metal-clad white laminate formed by: applying an organic solvent dispersion of the resin composition onto a metal foil which is produced in advance; and evaporating a solvent therefrom. It is particularly preferable that the white resin layer is a flexible metal-clad white laminate formed by: superimposing a metal foil which is produced in advance on the resin composition film which is produced in advance; and subjecting them to thermocompression bonding.

Effects of the Invention

The present invention provides a flexible metal-clad white laminate which uses a particular polyimide resin composition which is obtained by blending therein a white pigment, in particular, rutile titanium oxide having been subjected to a surface coating treatment. The flexible metal-clad white laminate of the present invention is excellent in whiteness and light resistance, and can particularly preferably be utilized for a printed wiring board on which a light emitting diode (LED) is mounted.

BEST MODE FOR CARRYING OUT THE INVENTION

The polyimide to be used in the present invention has a repeating unit represented by the above-mentioned general formula I.

The content of the repeating unit represented by the general formula I is preferably 10 to 100 mol % and more preferably 50 to 100 mol % of the total repeating units. It is particularly preferable that the content be substantially 100 mol %. In addition, the number of the repeating units represented by the general formula I in one molecule of the polyimide is preferably 10 to 2,000 and more preferably 20 to 200.

In the general formula I, R represents a tetravalent aliphatic group. Preferable examples of R include tetravalent substituents derived from cyclohexane, cyclopentane, cyclobutane, or bicyclo[2.2.2]oct-7-ene, and stereoisomers thereof. More specific examples of R include tetravalent aliphatic groups represented by the following structural formulae. In particular, tetravalent substituents derived from cyclohexane and stereoisomers thereof are preferable.

[Chem 2]

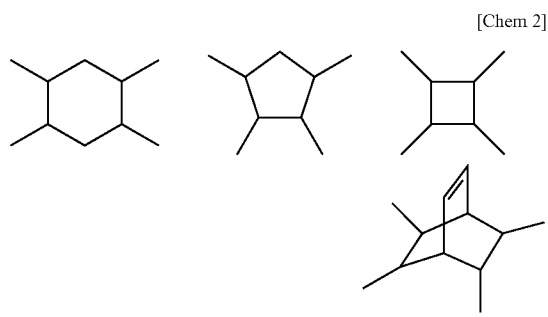

In the general formula I, Φ represents a structural unit having 2 to 39 carbon atoms. Examples of Φ include aliphatic structural units, alicyclic structural units, aromatic structural units, organosiloxane structural units, and structural units of combination or repetition of those. At least one partial structure selected from the group consisting of —O—, —SO$_2$—, —CO—, —CH$_2$—, —C(CH$_3$)$_2$—, —C$_2$H$_4$O—, and —S— may intervene in a main chain of Φ.

Preferable examples of Φ include: aliphatic structural units such as polyalkylene, (poly)oxyalkylene having alkyl or aromatic terminals, xylylene, and alkyl-substituted groups and halogen-substituted groups thereof; alicyclic structural units derived from cyclohexane, dicyclohexylmethane, dimethylcyclohexane, isophorone, norbornane, and alkyl-substituted groups and halogen-substituted groups thereof; aromatic structural units derived from benzene, naphthalene, biphenyl, diphenylmethane, diphenyl ether, diphenyl sulfone, benzophenone, and alkyl-substituted groups and halogen-substituted groups thereof; and organosiloxane structural units. More specifically, the examples include structural units represented by the following structural formulae.

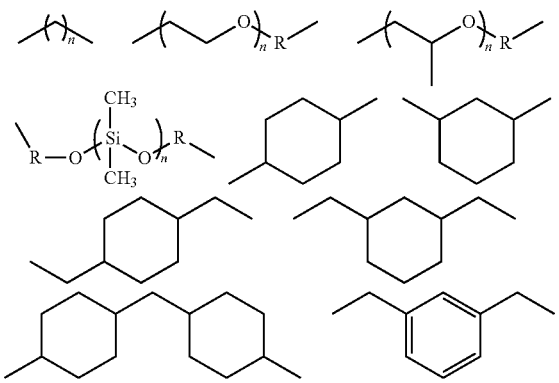

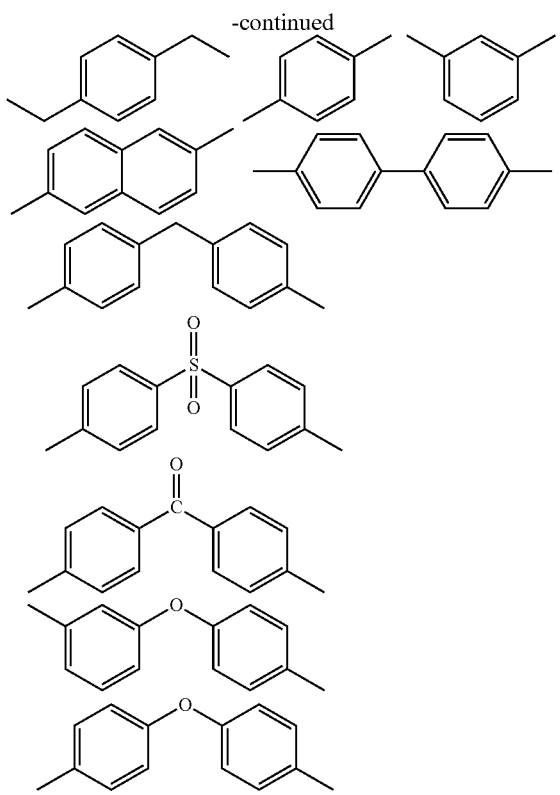

In the formulae, R represents a divalent aliphatic or aromatic group and n represents a numerical scope corresponding to the definition as described for Φ in the general formula I.

A polyimide to be used in the present invention is usually obtained by allowing a tetracarboxylic acid component and a diamine-based component (diamine or a derivative thereof) to react with each other in a solution.

Examples of the tetracarboxylic acid component to be used for the reaction include aliphatic tetracarboxylic acids, aliphatic tetracarboxylic acid alkyl esters, and aliphatic tetracarboxylic dianhydrides.

Specific examples of the tetracarboxylic acid component include 1,2,4,5-cyclohexanecarboxylic acid, 1,2,4,5-cyclohexanetetracarboxylic dianhydride, 1,2,4,5-cyclohexanetetra carboxylic acid methyl ester, 1,2,3,4-butanetetracarboxylic acid, 1,2,3,4-butanetetracarboxylic dianhydride, 1,2,3,4-butanetetracarboxylic acid methyl ester, 1,2,3,4-cyclobutanetetracarboxylic acid, 1,2,3,4-cyclobutanetetracarboxylic dianhydride, 1,2,3,4-cyclobutanetetracarboxylic acid methyl ester, 1,2,4,5-cyclopentanetetracarboxylic acid, 1,2,4,5-cyclopentanetetracarboxylic acid dianhydride, 1,2,4,5-cyclopentanetetracarboxylic acid methyl ester, 3-carboxymethyl-1,2,4-cyclopentanetricarboxylic acid, bicyclo[2.2.2]oct-7-ene-2,3,5,6-tetracarboxlic acid, bicyclo[2.2.2]oct-7-ene-2,3,5,6-tetracarboxlic dianhydride, bicyclo[2.2.2]oct-7-ene-2,3,5,6-tetracarboxlic acid methyl ester, dicyclohexyltetracarboxylic acid, dicyclohexyltetracarboxylic dianhydride, and dicyclohexyltetracarboxylic acid methyl ester. The tetracarboxylic acid components include positional isomers thereof.

Of the above-mentioned tetracarboxylic acid components, polyimides each having a cyclohexanetetracarboxylic acid skeleton is advantageous in that a flexible film can be obtained because the molecular weight thereof is easily increased, and is advantageous in terms of forming and processing a film therefrom because a solubility thereof to a solvent is sufficiently high. From those viewpoints, in particular, cyclohexanetetracarboxylic dianhydrides are preferable among those.

The tetracarboxylic acid component may contain at least one compound selected from the group consisting of other tetracarboxylic acids and derivatives thereof as long as the addition thereof adversely affects the solubility of the polyimide to solvents, and flexibility, thermocompression bonding property, and transparency of resultant films. Examples of the other tetracarboxylic acids and derivatives thereof include pyromellitic acid, 3,3',4,4'-biphenyltetracarboxylic acid, 2,3,3',4'-biphenyltetracarboxylic acid, 2,2-bis(3,4-dicarboxyphenyl)propane, 2,2-bis(2,3-dicarboxyphenyl)propane, 2,2-bis(3,4-dicarboxyphenyl)-1,1,1,3,3,3-hexafluoropropane, 2,2-bis(2,3-dicarboxyphenyl)-1,1,1,3,3,3-hexafluoropropane, bis(3,4-dicarboxyphenyl)sulfone, bis(3,4-dicarboxyphenyl)ether, bis(2,3-dicarboxyphenyl)ether, 3,3',4,4'-benzophenonetetracarboxylic acid, 2,2',3,3'-benzophenonetetracarboxylic acid, 4,4-(p-phenylenedioxy)diphthalic acid, 4,4-(m-phenylenedioxy)diphthalic acid, ethylenetetracarboxylic acid, 1,1-bis(2,3-dicarboxyphenyl)ethane, bis(2,3-dicarboxyphenyl)methane, bis(3,4-dicarboxyphenyl)methane, and derivatives thereof.

Examples of the diamine-based component used for the reaction include diamines, diisocyanates, and diaminodisilanes, with diamines being preferable. The content of the diamines in the diamine-based component is preferably 50 mol % or more (including 100 mol %).

The diamines may be aliphatic diamines, aromatic diamines, or mixtures thereof. In the present invention, the "aromatic diamine" means a diamine having amino groups directly bonded to an aromatic ring, which may contain an aliphatic group, alicyclic group, or another substituent in a part of its structure. The "aliphatic diamine" means a diamine having amino groups directly bonded to an aliphatic or alicyclic group, which may contain an aromatic group or another substituent in a part of its structure.

Examples of the aliphatic diamines include 4,4'-diaminodicyclohexylmethane, ethylenediamine, hexamethylenediamine, polyethylene glycol bis(3-aminopropyl)ether, polypropylene glycol bis(3-aminopropyl)ether, 1,3-bis(aminomethyl)cyclohexane, 1,4-bis(aminomethyl)cyclohexane, m-xylylenediamine, p-xylylenediamine, isophoronediamine, norbornanediamine, and siloxanediamines.

Examples of the aromatic diamines include 4,4'-diaminodiphenyl ether, 4,4'-diaminodiphenylmethane, 4,4'-diaminodiphenyl sulfone, m-phenylenediamine, p-phenylenediamine, diaminobenzophenone, 2,6-diaminonaphthalene, and 1,5-diaminonaphthalene.

The glass transition temperature of the polyimide that constitutes the resin composition A is determined depending mainly on the diamine to be selected, but is generally 350° C. or less. An adhesion property of the polyimide is expressed at a temperature equal to or higher than the glass transition temperature. An excessively high glass transition temperature is unsuitable because a thermocompression bonding temperature is made excessively high, and an excessively low glass transition temperature is not preferable because the heat resistance of a polyimide layer becomes insufficient. The glass transition temperature is in a range of preferably 200 to 350° C. and particularly preferably 250 to 320° C.

In general, the polyimide of the present invention is produced as an organic solvent solution.

Examples of the organic solvent which can be used include, but not limited to, N-methyl-2-pyrrolidone, N,N-diethylacetamide, N,N-dimethylacetamide, N,N-dimethylformamide, N,N-diethylformamide, N-methylcaprolactam, hexamethylphosphoramide, tetramethylenesulfone, dimethylsulfoxide, m-cresol, phenol, p-chlorophenol, 2-chloro-4-hydroxytoluene, diglyme, triglyme, tetraglyme, dioxane, γ-butyrolactone, dioxolane, cyclohexanone, and cyclopentanone. Two or more kinds of the organic solvents may be used in combination. When a polyimide solution composed of a polyimide and a solvent is used, it is preferable that N-methyl-2-pyrrolidone (NMP), N,N-dimethylacetamide (DMAC), or γ-butyrolactone (GBL) be used alone, or two or more of them be used in combination. In addition, in a case of production by solution polymerization, a poor solvent such as hexane, heptane, benzene, toluene, xylene, chlorobenzene, or o-dichlorobenzene can be used together with the above-mentioned solvents to the extent that no polymerized product is precipitated.

The polyimide can be produced by any production method using the above-mentioned tetracarboxylic dianhydride components and diamine components. Examples of the method include: (1) a solution polymerization method; (2) a method involving forming a film or the like using a polyamic acid solution and then allowing imidation of the film to proceed; (3) a method involving solid-phase polymerization using a salt or an oligomer; and (4) a method which uses, as raw materials, a tetracarboxylic dianhydride and diisocyanate. In addition, other conventionally-known methods can be used, and those methods can be used in combination. Further, conventionally-known catalysts such as acids, tertiary amines, and anhydrides can be used in the reaction.

The organic solvent solution of the polyimide is produced by any one of the following methods (1) to (3).

(1) After adding the tetracarboxylic acid component to an organic solvent solution of the diamine-based component or adding the diamine-based component to an organic solvent solution of the tetracarboxylic acid component, the resultant mixture is maintained preferably at 80° C. or less, in particular, at about room temperature or lower for 0.5 to 3 hours. After adding an azeotropic dehydrating solvent such as toluene or xylene to the resultant solution of the intermediate polyamic acid, the resultant mixture is subjected to dehydration while azeotropically removing the generated water out of the reaction system to obtain an organic solvent solution of the polyimide.

(2) After imidating the reaction intermediate polyamic acid by adding a dehydrating agent such as acetic anhydride into a solution of the polyamic acid obtained by using the same method as the method (1), the polyimide is precipitated by adding a poor solvent for the polyimide such as methanol. The solid polyimide separated by filtering, washing, and drying is dissolved in an organic solvent to obtain an organic solvent solution of the polyimide.

(3) According to the method (1), a solution of the polyamic acid prepared by using a high-boiling solvent such as cresol is maintained at 150 to 220° C. for 3 to 12 hours to allow the polyimidation to proceed. Then, the polyimide is precipitated by adding a poor solvent for the polyimide such as methanol. The solid polyimide separated by filtering, washing, and drying is dissolved in an organic solvent such as N,N-dimethylacetamide to obtain an organic solvent solution of the polyimide.

A tertiary amine compound can preferably be used as a catalyst in case of producing polyimide of the present invention by solution polymerization. Examples of the tertiary amine compound include trimethylamine, triethylamine (TEA), tripropylamine, tributylamine, triethanolamine, N,N-dimethylethanolamine, N,N-dimethylethanolamine, triethylenediamine, N-methylpyrrolidine, N-ethylpyrrolidone, N-methylpiperidine, N-ethylpiperidine, imidazole, pyridine, quinoline, and isoquinoline.

In addition, the concentration of the polyimide in a solution is preferably 5 to 70% by weight, more preferably 10 to 50% by weight, and particularly preferably 10 to 40% by weight. A concentration of less than 5% by weight is not preferable because the thickness of a resin composition layer tends to be uneven, and a concentration exceeding 70% by weight is not preferable because the viscosity of the solution becomes significantly large, thus making the solution difficult to handle.

The organic solvent solution of the polyimide is blended with a white pigment as described below, or may be added with a surfactant based on fluorine, polysiloxane, or the like. The addition of the surfactant makes it easy to obtain a polyimide layer or a polyimide film having good surface smoothness.

For the white pigment to be used in the present invention, it is preferable to use at least one kind selected from the group consisting of titanium oxide, zirconium oxide, calcium oxide, silicon oxide, zinc oxide, aluminum oxide, zinc sulfide, calcium sulfate, barium sulfate, lead carbonate, lead hydroxide, basic zinc molybdate, basic calcium zinc molybdate, lead white, molybdenum white, and lithopone.

Among those, a rutile titanium oxide having a coating layer formed on a surface thereof is more preferable. The coating layer is formed by a treatment with $SiO_2$ or $Al_2O_3$. Further, it is particularly preferable to use a rutile titanium oxide on which a coating layer obtained by the treatment with $SiO_2$ or $Al_2O_3$ is additionally subjected to a polyol treatment or a siloxane treatment.

Note that the white pigment is generally used in a form of a white pigment dispersion obtained by blending the white pigment in a polyimide solution. The blending may be performed before the synthesis and dissolution operation of the polyimide, during the synthesis, or after completion of the synthesis, or after the polyimide is diluted with a dilution solvent after the completion of the synthesis. In general, the blending is performed after the completion of the synthesis.

The white pigment may be stirred and dispersed in a stirring vessel provided with a stirring device having an appropriate stirring ability. Alternatively, the stirring and dispersing can be performed using a device to be used for mixing, such as a ball mill, or a mixing device of a rotation and revolution type.

The white pigment to be used in the present invention has a particle diameter of preferably 0.05 to 5 μm and more preferably 0.1 to 1 μm. A particle diameter of less than 0.05 μm is not preferable because light beam reflectance decreases. Meanwhile, a particle diameter exceeding 5 μm is not preferable because irregularity of the surface of a resin composition layer becomes obvious to cause deterioration in appearance or deterioration in mechanical properties, especially decrease in elongation at break.

In addition, a rate of content of the white pigment with respect to the polyimide is preferably 10 to 70% by weight and more preferably 20 to 50% by weight on the basis of the solid component. A rate of content exceeding 70% by weight is not preferable because mechanical properties, especially elongation at break, may be deteriorated or sufficient adhesion strength may not be obtained. In addition, a rate of content of less than 10% by weight is not preferable because sufficient reflectance and whiteness cannot be obtained.

The white resin layer of the present invention preferably has a reflectance of 50% or more at 410 nm to 780 nm. A reflectance of less than 50% is not preferable due to generation of striking-through of light.

In addition, the white resin layer preferably has a whiteness of 70 or more. A whiteness of less than 70 is not preferable because the resin layer may be colored with a tinge of yellow due to light absorption.

Further, in the present invention, it is preferable in terms of practical use that the white resin layer which has been exposed by removing the metal layer have a whiteness of 60 or more, and preferably 70 or more after the white resin layer is irradiated with a blue light beam having a wavelength spectrum of 400 nm to 480 nm with a wavelength peak at 420 nm in air in a light strength of 90 W/m2 per unit area of the white resin layer for continuously 1,000 hours. A whiteness of less than 60 is not preferable because the light absorption of the white resin layer increases, resulting in coloration in yellow.

Examples of the metal foil to be used for the metal layer include copper, aluminum, stainless steel, gold, silver, and nickel, with copper, aluminum, and stainless steel being preferable. The thickness of the metal foil is not particularly limited and is usually 5 to 100 µm in view of good processability.

In addition, the metal layer can be produced by sputtering, vapor deposition, electroless plating, or the like. Examples of the metal include copper, nickel, chromium, tin, cobalt, and gold. Preferable examples of the metal include copper, nickel, and gold, and the metal is appropriately formed into a multilayer. The thickness of a metal layer is not particularly limited, but is preferably a thickness which is difficult to be attained by any other methods, that is, 10 µm or less, and more preferably 2 to 10 µm in order to make best use of the thin-film formation method.

In the present invention, insulating substrates can appropriately be used.

Among the insulating substrates, one that is a flexible type is preferable. Examples of the flexible type insulating substrate include polyimides, polybenzimidazole, polybenzoxazole, polyamides including aramid, polyether imides, polyamide imides, polyesters including liquid crystal polyesters, polysulfones, polyether sulfones, polyether ketones, and polyether ether ketones, with polyimides, polybenzimidazole, polyamides including aramid, polyether imides, polyamide imides, and polyether sulfones being preferable. In addition, the resin composition of the present invention can of course be used for the insulating substrate. The thickness of the flexible type insulating substrate is not particularly limited, but is preferably 3 to 150 µm.

In addition, those insulating substrates are used to obtain single-sided metal foil-clad sheets and films which are then used to produce printed wiring sheets and films. The printed wiring sheets and films can be used for metal foil clad like the insulating substrates, to thereby provide multilayer printed wiring sheets and films.

The flexible metal-clad white laminate of the present invention is generally produced by any one of the following methods (1) to (4) using the above-mentioned constituents.

(1) A method which involves: applying a solution of a white resin to a metal foil; and removing a solvent.

(2) A method which involves: superimposing a metal foil on a film of a white resin which has been produced in advance; and subjecting the resultant to thermocompression bonding.

(3) A method which involves: superimposing a metal foil on an insulating substrate on which a white resin layer has been formed in advance; and subjecting the resultant to thermocompression bonding.

(4) A method which involves: forming a metal layer on a film of a white resin which has been produced in advance or on an insulating substrate having formed thereon a white resin layer by sputtering, vapor deposition, any other vapor-phase methods, electroless plating, or the like; and appropriately subjecting the resultant to electrolytic plating.

Since the polyimide represented by the general formula I of the present invention can be used in a form of a solution and can be subjected to thermocompression bonding, the methods (1) to (3) which utilize those characteristics are preferable, and the methods (1) and (2) are particularly preferable.

The above-mentioned methods which involve producing a film of a white resin in advance are generally performed by: applying a white resin solution onto a substrate having peel ability imparted thereto; removing a solvent; peeling; and appropriately drying the resultant.

In the method which involves forming a white resin layer on a metal foil or an insulating substrate or the method which involves producing a film of a white resin in advance, the solvent is generally evaporated and removed at a temperature of 100 to 350° C. by appropriately evaporating the solvent under inert atmosphere or reduced pressure.

The film or white resin layer has a thickness of 3 to 100 µm. The film of a white resin or the white resin layer which is formed on a metal foil generally has a thickness selected from a range of 15 to 100 µm, and the white resin layer which is formed on an insulating substrate generally has a thickness selected from a range of 3 to 50 µm.

Note that, when a vapor deposition method is used in the method (4), CVD, ion plating, or the like can be utilized in addition to the typical vapor deposition. In a case of forming the metal layer by the vapor deposition method, the surface of the white resin layer may be subjected to a known pre-treatment such as a treatment with an alkaline chemical solution, plasma treatment, or sandblast treatment before the metal layer is formed. The pre-treatment additionally increases the adhesion strength between the resin composition film and the metal layer.

In addition, the white resin layer can be laminated on a surface of a metal foil, an insulating substrate, a printed wiring mesh, or the like and can be integrated therewith by the thermocompression bonding.

Further, the following can appropriately be performed. A metal foil, a white resin layer surface of a metal foil having formed thereon a white resin layer, an insulating film, or a metal foil having formed thereon a white resin layer, and an insulating film, a white resin film, a metal foil, and the like are superimposed on a white resin layer and the whole is subjected to thermocompression bonding, to thereby produce a double-sided metal-clad sheet. Further, white resin layers obtained by the above-mentioned methods can be superimposed on wiring of a printed wiring board and the whole can be then subjected to thermocompression bonding to thereby form a multilayer. Note that the printed wiring board includes those produced from the flexible metal-clad white laminate of the present invention without question.

The thermocompression bonding may be performed by hot press, or may be performed continuously using a press roller. The thermocompression bonding is preferably performed at a temperature of preferably 200 to 400° C., and more preferably 250 to 350° C., and with an applied pressure of preferably 0.1 to 200 kgf/cm$^2$, and more preferably 1 to 100 kgf/cm$^2$. In addition, the thermocompression bonding may be performed under reduced pressure to remove a solvent and bubbles. The flexible metal-clad white laminate produced under the above-mentioned conditions has extremely good adhesion strength between the metal layer and the resin composition layer. For example, an adhesion strength of 1 kgf/cm$^2$ or more can be achieved between an electrolyzed copper foil and a resin composition layer.

The polyimide constituting the resin composition A to be used in the present invention is soluble to the organic solvents as exemplified above. Therefore, patterns can be made on the resin composition layer of any one of the metal-clad white laminates obtained by the above-mentioned methods and a printed wiring board after formation of a circuit pattern by wet-etching using an aprotic polar organic solvent as an etchant. This process can be applied to, for example, formation of a via hole or a flying lead, or removal of a cover coat of a terminal portion.

EXAMPLES

Hereinafter, the present invention will be described in detail by way of examples. Note that, however, the present invention is not limited to these examples.

Polyimide films, resin composition films, single-sided flexible copper-clad laminate plates, and double-sided flexible copper-clad laminate plates which were obtained in Examples and Comparative Examples are evaluated as shown below. In addition, the particle size of a used white pigment was determined as shown below.

(1) Glass Transition Temperature

A glass transition temperature was determined by DSC measurement under the condition of a temperature rise rate of 10° C./min using a differential scanning calorimeter "DSC-50" which is available from Shimadzu Corporation.

(2) Adhesion Strength

A peeling strength at 90° was determined using a rotation equipment according to JIS C 6471.

(3) Reflectance

A spectral reflectance was determined using a color difference meter ERP-80WX manufactured by Tokyo Denshoku Co., Ltd. by irradiating a resin composition layer with light beams of 457 nm and 550 nm.

(4) Whiteness

A reflectance of light when a standard plate (magnesium oxide plate) was irradiated with a light beam of a wavelength of 457 nm was determined using a color difference meter ERP-80WX manufactured by Tokyo Denshoku Co., Ltd. Then, the reflectance of the light was regarded as 100%, and the reflectance of the resin composition layer was indicated by a percentage with respect thereto.

(5) Light Resistance

A light resistance was represented by a whiteness obtained after a sample was irradiated with a blue light beam having a wavelength spectrum of 400 nm to 480 nm with a wavelength peak at 420 nm in air in a light strength of 90 W/m$^2$ per unit area of the resin composition layer for continuously 1,000 hours.

(6) Particle Diameter

A particle diameter was determined using Laser Scattering Particle Size Distribution Analyzer LA-910 manufactured by Horiba Ltd. and water as a dispersion medium by applying ultrasonic waves until the transmittance became stationary. A particle diameter which corresponds to 50% accumulation on the basis of volume was referred to as a median diameter.

Reference Example 1

Synthesis of 1,2,4,5-cyclohexanetetracarboxylic dianhydride

A 5-L Hastelloy (HC22) autoclave was charged with 552 g of pyromellitic acid, 200 g of a catalyst, that is, rhodium carried on activated carbon, available from N.E. Chemcat Corporation, and 1,656 g of water. The inner atmosphere of the reactor was replaced with nitrogen gas under stirring. After replacing the inner atmosphere of the reactor with hydrogen gas, the hydrogen pressure in the reactor was adjusted to 5.0 MPa and the temperature was raised to 60° C. While maintaining the hydrogen pressure at 5.0 MPa, the reaction was allowed to proceed for 2 hours. Then, after replacing the hydrogen gas in the reactor with nitrogen gas, the reaction product solution taken out of the autoclave was filtered while it was still hot to separate the catalyst. The filtrate was concentrated by evaporating water under reduced pressure using a rotary evaporator to precipitate crystals. The precipitated crystals were separated by solid-liquid separation at room temperature and dried, thereby obtaining 481 g of 1,2,4,5-cyclohexanetetracarboxylic acid (yield: 85.0%).

Subsequently, 450 g of the obtained 1,2,4,5-cyclohexanetetracarboxylic acid and 4,000 g of acetic anhydride were charged into a 5-L glass separable flask equipped with a Dimroth condenser. The inner atmosphere of the reactor was replaced with nitrogen gas under stirring. The temperature was raised to the refluxing temperature of the solvent under a nitrogen gas atmosphere to allow the solvent to reflux for 10 min. After that, the temperature was decreased to room temperature under stirring to precipitate crystals. The precipitated crystals were separated by solid-liquid separation and dried to obtain primary crystals. The mother liquor after separation was concentrated under reduced pressure using a rotary evaporator to precipitate crystals. The precipitated crystals were separated by solid-liquid separation and dried to obtain secondary crystals. In total of the primary and secondary crystals, 375 g of 1,2,4,5-cyclohexanetetracarboxylic dianhydride was obtained (yield of the dianhydride: 96.6%).

Reference Example 2

In a 500-mL five-necked flask equipped with a thermometer, a stirrer, a nitrogen inlet, a branched dropping funnel, a Dean-Stark trap, and a condenser, 10.0 g (0.05 mol) of 4,4'-diaminodiphenyl ether was dissolved in 85 g of N-methyl-2-pyrrolidone as a solvent under a nitrogen gas flow. Into the resultant solution, 11.2 g (0.05 mol) of the solid 1,2,4,5-cyclohexanetetracarboxylic dianhydride synthesized in Reference Example 1 was added in several portions over 1 hour at room temperature, and the whole was stirred for 2 hours at room temperature. Then, 30.0 g of xylene as an azeotropic dehydrating solvent was added to the solution, and the temperature was raised to 180° C. to allow the reaction to proceed for 3 hours, while azeotropically removing the generated water with xylene being allowed to reflux through the Dean-Stark trap.

After 3 hours, it was confirmed that the water was no longer distilled. Then, the temperature was raised to 190° C. over 1 hour to recover 29.0 g of xylene by distillation. After reducing the inner temperature to 60° C. by air cooling, an organic solvent solution of polyimide was obtained. The obtained organic solvent solution of polyimide was applied onto a glass plate and heated for 1 hour on a hot plate at 90° C. to evaporate the solvent. The resultant film was separated from the glass plate to obtain a self-supporting film. The self-supporting film was fixed to stainless steel frames and then heated in a hot-air dryer at 220° C. for 2 hours to further evaporate the solvent, thereby obtaining a 100 μm-thick light-brown flexible film. By IR spectrum analysis of the obtained film, the characteristic absorption of an imide ring was determined at ν (C=O) 1772, 1700 (cm$^{-1}$), and the product was identified as a polyimide having repeating units represented by the following formula II:

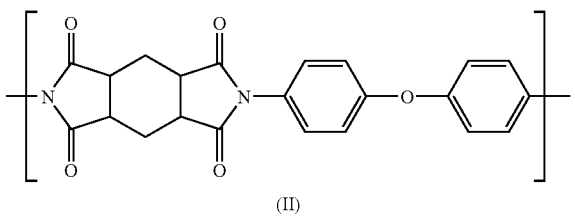

(II)

The resultant film had a glass transition temperature of 315° C. In addition, a total light transmittance of the film was determined using a haze meter (Z-Σ80, manufactured by Nippon Denshoku) according to JIS K7105, and as a result, the film had a high value of 90%.

The polyimide film was subjected to heat treatment at 220° C. for 4 hours in air, and the total light transmittance before and after the treatment was determined. It was found that the total light transmittance after the treatment was 90%, so no change occurred. In addition, no coloration was visually observed.

Reference Example 3

In a 500-mL five-necked flask equipped with a thermometer, a stirrer, a nitrogen inlet, a branched dropping funnel, a Dean-Stark trap, and a condenser, 10.0 g (0.05 mol) of 4,4'-diaminodiphenyl ether was dissolved in 85 g of N-methyl-2-pyrrolidone as a solvent under a nitrogen gas flow. Into the resultant solution, 12.3 g (0.05 mol) of the solid cyclopentane-1,2,3,4-tetracarboxylic acid (manufactured by Sigma-Aldrich Co.) was added in several portions over 1 hour at room temperature, and the whole was stirred for 2 hours at room temperature. Then, 30.0 g of xylene as an azeotropic dehydrating solvent was added to the solution, and the temperature was raised to 180° C. to allow the reaction to proceed for 7 hours, while azeotropically removing the generated water with xylene being allowed to reflux through the Dean-Stark trap.

After 3 hours, it was confirmed that the water was no longer distilled. Then, the temperature was raised to 190° C. over 1 hour to recover 29.0 g of xylene by distillation. After reducing the inner temperature to 60° C. by air cooling, an organic solvent solution of polyimide was obtained. The obtained organic solvent solution of polyimide was applied onto a glass plate and heated for 1 hour on a hot plate at 90° C. to evaporate the solvent. The resultant film was separated from the glass plate to obtain a self-supporting film. The self-supporting film was fixed to stainless steel frames and then heated in a hot-air dryer at 220° C. for 2 hours to further evaporate the solvent, thereby obtaining a 100 μm-thick light-brown flexible film. By IR spectrum analysis of the obtained film, the characteristic absorption of an imide ring was determined at ν (C=O) 1772, 1700 (cm$^{-1}$), and the product was identified as a polyimide having repeating units represented by the following formula III:

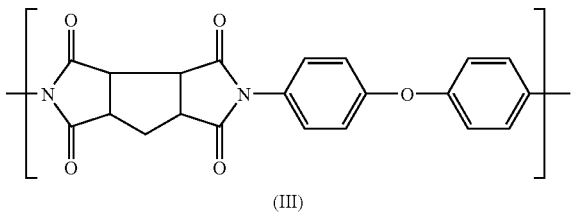

(III)

A total light transmittance of the resultant film was determined using a haze meter (Z-Σ80, manufactured by Nippon Denshoku) according to JIS K7105, and as a result, the film had a high value of 89%.

The polyimide film was subjected to heat treatment at 220° C. for 4 hours in air, and the total light transmittance before and after the treatment was determined. It was found that the total light transmittance after the treatment was 89%, so no change occurred. In addition, no coloration was visually observed.

Reference Example 4

In a 500-mL five-necked flask equipped with a thermometer, a stirrer, a nitrogen inlet, a branched dropping funnel, a Dean-Stark trap, and a condenser, 10.0 g (0.05 mol) of 4,4'-diaminodiphenyl ether was dissolved in 85 g of N-methyl-2-pyrrolidone as a solvent under a nitrogen gas flow. Into the resultant solution, 10.9 g (0.05 mol) of a solid pyromellitic dianhydride was added in several portions over 1 hour at room temperature, and the whole was stirred for 2 hours at room temperature. The obtained organic solvent solution of polyamic acid was applied onto a glass plate and heated for 1 hour on a hot plate at 90° C. to evaporate the solvent. The resultant film was separated from the glass plate to obtain a self-supporting film. The self-supporting film was fixed to stainless steel frames, heated in a hot-air dryer at 220° C. for 2 hours to further evaporate the solvent, and then heated at 300° C. for 1 hour for heat imidation, thereby obtaining a 100 μm-thick brown flexible film. By IR spectrum analysis of the obtained film, the characteristic absorption of an imide ring was determined at ν (C=O) 1772, 1700 (cm$^{-1}$), and the product was identified as a polyimide having repeating units represented by the following formula IV:

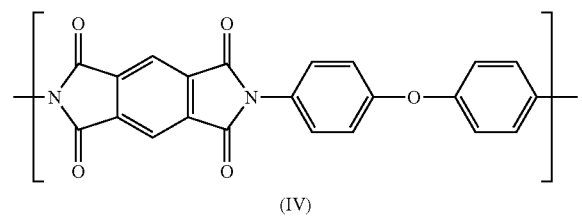

(IV)

A total light transmittance of the resultant film was determined using a haze meter (Z-Σ80, manufactured by Nippon Denshoku) according to JIS K7105, and as a result, the film had a value of 48%.

Example 1

In a 300-ml mayonnaise bottle were added 55 g (solid content was 10 g) of the organic solvent solution of the polyimide synthesized in Reference Example 2, 5 g of rutile titanium oxide having a median diameter of 0.43 μm (PF-691, manufactured by Ishihara Sangyo Kaisha, Ltd.) (titanium oxide to which surface treatments such as SiO$_2$ treatment, polyol treatment, and siloxane treatment were applied in the stated order), and 30 g of N-methylpyrrolidone. The mixture was further added with 10 g of alumina beads each having a diameter of 2 mm. The lid of the bottle was tightly shut, and a protective tape was attached onto the outer side of the bottle so that the mayonnaise bottle would not break. The bottle was heated for 30 minutes in a hot-air dryer heated to 80° C., and then fixed on Paint Conditioner Red Devil Tool manufactured by UNION, N.J. to mix and disperse the components for 30 minutes. The alumina beads were filtrated out, thus obtaining a resin composition.

Subsequently, the resultant resin composition was applied onto an electrolyzed copper foil having a thickness of 18 μm (3EC-VLP, manufactured by Mitsui Mining & Smelting Co., Ltd.). The whole was heated for 1 hour on a hot plate at 100° C. to evaporate the solvent. After that, the resultant was fixed to stainless steel frames and then heated in a hot-air dryer at 220° C. for 2 hours to further evaporate the solvent, thereby obtaining a single-sided flexible copper-clad white laminate (resin composition layer was 25 μm-thick).

In addition, an 18 μm-thick electrolyzed copper-foil of the same specification which was separately prepared was superimposed on the resin composition layer surface of the resultant single-sided flexible copper-clad white laminate. The whole was inserted between two metal molds, and subjected to thermocompression bonding with the maximum pressure of 50 kgf/cm$^2$ for 30 minutes using a hot press at 330° C. After that, the entire resultant product including the metal molds was taken out therefrom and cooled in a cooling press for 5 minutes, and then taken out therefrom, thereby obtaining a double-sided flexible copper-clad white laminate. The double-sided flexible copper-clad white laminate had an adhesion strength of 1.1N/mm. The double-sided flexible copper-clad white laminate was subjected to etching to remove the copper foil thereon, and a resultant white surface was evaluated for reflectance, whiteness, and light resistance. Table 1 shows the results.

Example 2

The organic solvent dispersion of the resin composition obtained in Example 1 was applied onto Kapton 200H having a thickness of 52.8 μm (manufactured by Du Pont-Toray Co., Ltd.) which had preliminarily been washed with ethanol, and heated for 1 hour on a hot plate at 100° C. to evaporate the solvent. The resultant was fixed to stainless steel frames and then heated in a hot-air dryer at 220° C. for 2 hours to further evaporate the solvent, thereby obtaining a 4 μm-thick resin composition layer. Further, a rough surface of an electrolyzed copper foil having a thickness of 18 μm (3EC-VLP, manufactured by Mitsui Mining & Smelting Co., Ltd.) was superimposed on the resin composition layer, and a flexible copper-clad white laminate was obtained in the same manner as in Example 1. The flexible copper-clad white laminate had an adhesion strength of 1.1 N/mm.

The flexible copper-clad white laminate was subjected to etching to remove the copper foil thereon, and a resultant resin composition layer was evaluated for reflectance and whiteness. Table 1 shows the results.

Example 3

A single-sided flexible copper-clad white laminate having a resin composition layer of 25 μm was obtained in the same manner as in Example 1 except that a resin composition obtained by using 7.5 g of rutile titanium oxide having a median diameter of 0.43 μm (PF-691, manufactured by Ishihara Sangyo Kaisha, Ltd.) was used instead of that obtained by using 5 g of the rutile titanium oxide having a median diameter of 0.43 μm (PF-691, manufactured by Ishihara Sangyo Kaisha, Ltd.). The single-sided flexible copper-clad white laminate was subjected to etching to remove the copper foil thereon, and a resultant white surface was evaluated for reflectance, whiteness, and light resistance. Table 1 shows the results.

Example 4

A flexible copper-clad white laminate having a resin composition layer of 4 μm was obtained in the same manner as in Example 2 except that the resin composition obtained in Example 3 was used. The flexible copper-clad white laminate had an adhesion strength of 1.1 N/mm. The flexible copper-clad white laminate was subjected to etching to remove the copper foil thereon, and a resultant resin composition layer was evaluated for reflectance and whiteness. Table 1 shows the results.

Example 5

A single-sided flexible copper-clad white laminate having a resin composition layer of 25 μm was obtained in the same manner as in Example 1 except that the kind of the titanium oxide was changed to 5 g of rutile titanium oxide having a median diameter of 0.55 μm (PC-3, manufactured by Ishihara Sangyo Kaisha, Ltd.) (titanium oxide to which surface treatments such as $SiO_2$ treatment, polyol treatment, and siloxane treatment were applied in the stated order) instead of 5 g of the rutile titanium oxide having a median diameter of 0.43 μm (PF-691, manufactured by Ishihara Sangyo Kaisha, Ltd., which was subjected to siloxane treatment). The single-sided flexible copper-clad white laminate was subjected to etching to remove the copper foil thereon, and a resultant white surface was evaluated for reflectance, whiteness, and light resistance. Table 1 shows the results.

Example 6

A single-sided flexible copper-clad white laminate having a resin composition layer of 25 μm was obtained in the same manner as in Example 1 except that the kind of the titanium oxide was changed to 5 g of rutile titanium oxide having a median diameter of 0.64 μm (PF-711, manufactured by Ishihara Sangyo Kaisha, Ltd.) (titanium oxide to which surface treatments such as $SiO_2$ treatment and polyol treatment were applied in the stated order) instead of 5 g of the rutile titanium oxide having a median diameter of 0.43 μm (PF-691, manufactured by Ishihara Sangyo Kaisha, Ltd., which was subjected to siloxane treatment). The single-sided flexible copper-clad white laminate was subjected to etching to remove the copper foil thereon, and a resultant white surface was evaluated for reflectance, whiteness, and light resistance. Table 1 shows the results.

Example 7

A single-sided flexible copper-clad white laminate having a resin composition layer of 25 μm was obtained in the same manner as in Example 1 except that the kind of the titanium oxide was changed to 5 g of rutile titanium oxide having a median diameter of 0.67 μm (CR-90-2, manufactured by Ishihara Sangyo Kaisha, Ltd.) (titanium oxide to which surface treatments such as $SiO_2$ treatment and polyol treatment were applied in the stated order) instead of 5 g of the rutile titanium oxide having a median diameter of 0.43 μm (PF-691, manufactured by Ishihara Sangyo Kaisha, Ltd., which was subjected to siloxane treatment). The single-sided flexible copper-clad white laminate was subjected to etching to remove the copper foil thereon, and a resultant white surface was evaluated for reflectance, whiteness, and light resistance. Table 1 shows the results.

Example 8

A single-sided flexible copper-clad white laminate having a resin composition layer of 25 μm was obtained in the same manner as in Example 1 except that the kind of the titanium oxide was changed to 5 g of rutile titanium oxide having a median diameter of 0.75 μm (CR-80, manufactured by Ishihara Sangyo Kaisha, Ltd.) (titanium oxide to which $SiO_2$ treatment was applied) instead of 5 g of the rutile titanium oxide having a median diameter of 0.43 μm (PF-691, manufactured by Ishihara Sangyo Kaisha, Ltd., which was subjected to siloxane treatment). The single-sided flexible copper-clad white laminate was subjected to etching to remove the copper foil thereon, and a resultant white surface was evaluated for reflectance, whiteness, and light resistance. Table 1 shows the results.

Example 9

A single-sided flexible copper-clad white laminate having a resin composition layer of 25 μm was obtained in the same manner as in Example 1 except that the kind of the titanium oxide was changed to 5 g of rutile titanium oxide having a median diameter of 0.77 μm (SR-1, manufactured by Sakai Chemical Industry Co., Ltd.) (titanium oxide to which $Al_2O_3$ treatment was applied) instead of 5 g of the rutile titanium oxide having a median diameter of 0.43 μm (PF-691, manufactured by Ishihara Sangyo Kaisha, Ltd., which was subjected to siloxane treatment). The single-sided flexible copper-clad white laminate was subjected to etching to remove the copper foil thereon, and a resultant white surface was evaluated for reflectance, whiteness, and light resistance. Table 1 shows the results.

Example 10

In a 300-ml mayonnaise bottle were added 53 g (solid content was 10 g) of the organic solvent solution of the polyimide synthesized in Reference Example 3, 5 g of rutile titanium oxide having a median diameter of 0.43 μm (PF-691, manufactured by Ishihara Sangyo Kaisha, Ltd.) (titanium oxide to which surface treatments such as $SiO_2$ treatment, polyol treatment, and siloxane treatment were applied in the stated order), and 30 g of N-methylpyrrolidone. The mixture was further added with 10 g of alumina beads each having a diameter of 2 mm. The lid of the bottle was tightly shut, and a protective tape was attached onto the outer side of the bottle so that the mayonnaise bottle would not break. The bottle was heated for 30 minutes in a hot-air dryer heated to 80° C., and then fixed on Paint Conditioner Red Devil Tool manufactured by UNION, N.J. to mix and disperse the components for 30 minutes. The alumina beads were filtrated out, thus obtaining a resin composition.

Subsequently, the resultant resin composition was applied onto an electrolyzed copper foil having a thickness of 18 μm (3EC-VLP, manufactured by Mitsui Mining & Smelting Co., Ltd.). The whole was heated for 1 hour on a hot plate at 100° C. to evaporate the solvent. After that, the resultant was fixed to stainless steel frames and then heated in a hot-air dryer at 220° C. for 2 hours to further evaporate the solvent, thereby obtaining a single-sided flexible copper-clad white laminate (resin composition layer was 25 μm-thick). The single-sided flexible copper-clad white laminate was subjected to etching to remove the copper foil thereon, and a resultant white surface was evaluated for reflectance, whiteness, and light resistance. Table 1 shows the results.

Comparative Example 1

In a 300-ml mayonnaise bottle were added 55 g (solid content was 10 g) of the organic solvent solution of the polyamic acid synthesized in Reference Example 4, 5 g of rutile titanium oxide having a median diameter of 0.43 μm (PF-691, manufactured by Ishihara Sangyo Kaisha, Ltd.) (titanium oxide to which surface treatments such as $SiO_2$ treatment, polyol treatment, and siloxane treatment were applied in the stated order), and 30 g of N-methylpyrrolidone. The mixture was further added with 10 g of alumina beads each having a diameter of 2 mm. The lid of the bottle was tightly shut, and a protective tape was attached onto the outer side of the bottle so that the mayonnaise bottle would not break. The bottle was heated for 30 minutes in a hot-air dryer heated to 80° C., and then fixed on Paint Conditioner Red Devil Tool manufactured by UNION, N.J. to mix and disperse the components for 30 minutes. The alumina beads were filtrated out, thus obtaining a resin composition.

Subsequently, the resultant resin composition was applied onto an electrolyzed copper foil having a thickness of 18 μm (3EC-VLP, manufactured by Mitsui Mining & Smelting Co., Ltd.). The whole was heated for 1 hour on a hot plate at 100° C. to evaporate the solvent. After that, the resultant was fixed to stainless steel frames, then heated in a hot-air dryer at 220° C. for 2 hours to further evaporate the solvent, and then heated at 300° C. for 1 hour for heat imidation, thereby obtaining a single-sided flexible copper-clad white laminate (resin composition layer was 25 μm-thick). The single-sided flexible copper-clad white laminate was subjected to etching to remove the copper foil thereon, and a resultant white surface was evaluated for reflectance, whiteness, and light resistance. Table 1 shows the results.

Comparative Example 2

A single-sided flexible copper-clad white laminate having a resin composition layer of 25 μm was obtained in the same manner as in Example 1 except that a resin composition obtained by using 1 g of rutile titanium oxide having a median diameter of 0.43 μm (PF-691, manufactured by Ishihara Sangyo Kaisha, Ltd.) was used instead of that obtained by using 5 g of the rutile titanium oxide having a median diameter of 0.43 μm (PF-691, manufactured by Ishihara Sangyo Kaisha, Ltd.). The single-sided flexible copper-clad white laminate was subjected to etching to remove the copper foil thereon, and a resultant white surface was evaluated for reflectance, whiteness, and light resistance. Table 1 shows the results.

Example 11

The organic solvent dispersion of the resin composition obtained in Example 1 was applied onto a glass plate and heated for 1 hour on a hot plate at 90° C. to evaporate the solvent. The resultant film was separated from the glass plate to obtain a self-supporting film. The self-supporting film was fixed to stainless steel frames and then heated in a hot-air dryer at 220° C. for 2 hours to further evaporate the solvent, thereby obtaining a 4 μm-thick flexible film.

Subsequently, Kapton 200H having a thickness of 52.8 μm (manufactured by Du Pont-Toray Co., Ltd.) which had preliminarily been washed with ethanol was superimposed on the resultant resin composition film. Further, a rough surface of an electrolyzed copper foil having a thickness of 18 μm (3EC-VLP, manufactured by Mitsui Mining & Smelting Co., Ltd.) was super imposed on the resin composition film. The whole was inserted between two metal molds, and subjected to thermocompression bonding using a hot press at 330° C. and 50 kgf/cm² for 30 minutes. After that, the entire resultant product including the metal molds was taken out therefrom and cooled in a cooling press for 5 minutes, and then taken out therefrom, thereby obtaining a flexible copper-clad white laminate. The flexible copper-clad white laminate had an adhesion strength of 1.1 N/mm.

The flexible copper-clad white laminate was subjected to etching to remove the copper foil thereon, and a resultant resin composition layer was evaluated for reflectance and whiteness. Table 1 shows the results.

Example 12

The organic solvent dispersion of the resin composition obtained in Example 10 was applied onto Kapton 200H having a thickness of 52.8 μm (manufactured by Du Pont-Toray Co., Ltd.) which had preliminarily been washed with ethanol, and heated for 1 hour on a hot plate at 100° C. to evaporate the solvent. The resultant was fixed to stainless steel frames and then heated in a hot-air dryer at 220° C. for 2 hours to further evaporate the solvent, thereby obtaining a 4 μm-thick resin composition layer. Further, a rough surface of an electrolyzed copper foil having a thickness of 18 μm (3EC-VLP, manufactured by Mitsui Mining & Smelting Co., Ltd.) was superimposed on the resin composition film. The whole was inserted between two metal molds, and subjected to thermocompression bonding using a hot press at 330° C. and 50 kgf/cm² for 30 minutes. After that, the entire resultant product including the metal molds was taken out therefrom and cooled in a cooling press for 5 minutes, and then taken out therefrom, thereby obtaining a flexible copper-clad white laminate. The flexible copper-clad white laminate had an adhesion strength of 1.1 N/mm.

The flexible copper-clad white laminate was subjected to etching to remove the copper foil thereon, and a resultant resin composition layer was evaluated for reflectance and whiteness. Table 1 shows the results.

Comparative Example 3

The organic solvent dispersion of the resin composition obtained in Comparative Example 1 was applied onto Kapton 200H having a thickness of 52.8 μm (manufactured by Du Pont-Toray Co., Ltd.) which had preliminarily been washed with ethanol, and heated for 1 hour on a hot plate at 100° C. to evaporate the solvent. The resultant was fixed to stainless steel frames and then heated in a hot-air dryer at 220° C. for 2 hours to further evaporate the solvent, thereby obtaining a 4 μm-thick resin composition layer. Further, a rough surface of an electrolyzed copper foil having a thickness of 18 μm (3EC-VLP, manufactured by Mitsui Mining & Smelting Co., Ltd.) was superimposed on the resin composition layer. The whole was inserted between two metal molds, and subjected to thermocompression bonding using a hot press at 330° C. and 50 kgf/cm² for 30 minutes. After that, the entire resultant product including the metal molds was taken out therefrom and cooled in a cooling press for 5 minutes, and then taken out therefrom, thereby obtaining a flexible copper-clad white laminate. The flexible copper-clad white laminate had an adhesion strength of 1.1 N/mm. The flexible copper-clad white laminate was subjected to etching to remove the copper foil thereon, and a resultant resin composition layer was evaluated for reflectance and whiteness. Table 1 shows the results.

TABLE 1

| | Titanium oxide | | Reflectance (%) | Reflectance (%) | | Light |
| --- | --- | --- | --- | --- | --- | --- |
| | (Product name) | (%) | 457 nm | 550 nm | Whiteness | resistance |
| Example 1 | PF691 | 33 | 95 | 86 | 86 | 77 |
| Example 2 | PF691 | 33 | 94 | 86 | 84 | 76 |
| Example 3 | PF691 | 43 | 96 | 88 | 86 | 76 |
| Example 4 | PF691 | 43 | 95 | 87 | 86 | 75 |
| Example 5 | PC3 | 33 | 80 | 77 | 72 | 65 |
| Example 6 | PF711 | 33 | 84 | 80 | 76 | 63 |
| Example 7 | CR-90-2 | 33 | 87 | 82 | 78 | 65 |
| Example 8 | CR-80 | 33 | 79 | 78 | 71 | 62 |
| Example 9 | SR1 | 33 | 72 | 80 | 75 | 62 |
| Example 10 | PF691 | 33 | 88 | 79 | 79 | 68 |
| Example 11 | PF691 | 33 | 92 | 84 | 83 | 75 |
| Example 12 | PF691 | 33 | 87 | 77 | 78 | 66 |
| Comparative example 1 | PF691 | 33 | 30 | 52 | 25 | 13 |
| Comparative example 2 | PF691 | 9 | 68 | 74 | 61 | 4|3 |
| Comparative example 3 | PF691 | 33 | 28 | 49 | 25 | 11 | evaporate the solvent, thereby obtaining a 4 μm-thick resin composition layer. Further, a rough surface of an electrolyzed copper foil having a thickness of 18 μm (3EC-VLP, manufactured by Mitsui Mining & Smelting Co., Ltd.) was superimposed on the resin composition film. The whole was inserted between two metal molds, and subjected to thermocompression bonding using a hot press at 330° C. and 50 kgf/cm² for 30 minutes. After that, the entire resultant product including the metal molds was taken out therefrom and cooled in a cooling press for 5 minutes, and then taken out therefrom, thereby obtaining a flexible copper-clad white laminate. The flexible copper-clad white laminate had an adhesion strength of 1.1 N/mm.

The flexible copper-clad white laminate was subjected to etching to remove the copper foil thereon, and a resultant resin composition layer was evaluated for reflectance and whiteness. Table 1 shows the results.

INDUSTRIAL APPLICABILITY

The metal-clad white laminate of the present invention can preferably be used for printed wiring substrates, in particular, printed wiring substrates on which light emitting diodes (LEDs) are mounted. In particular, the metal-clad white laminate of the present invention can preferably be applied to formation of a via hole or a flying lead, or removal of a cover coat of a terminal portion.

The invention claimed is:

1. A metal-clad white laminate, comprising:
a white resin layer composed of a resin composition which is obtained by mixing a polyimide having a repeating unit as represented by the general formula I with a white pigment:

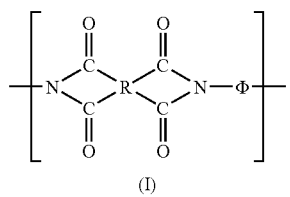

(I)

wherein R represents a tetravalent aliphatic group which is derived from cyclohexane; Φ represents a structural unit represented by at least one selected from the group consisting of:

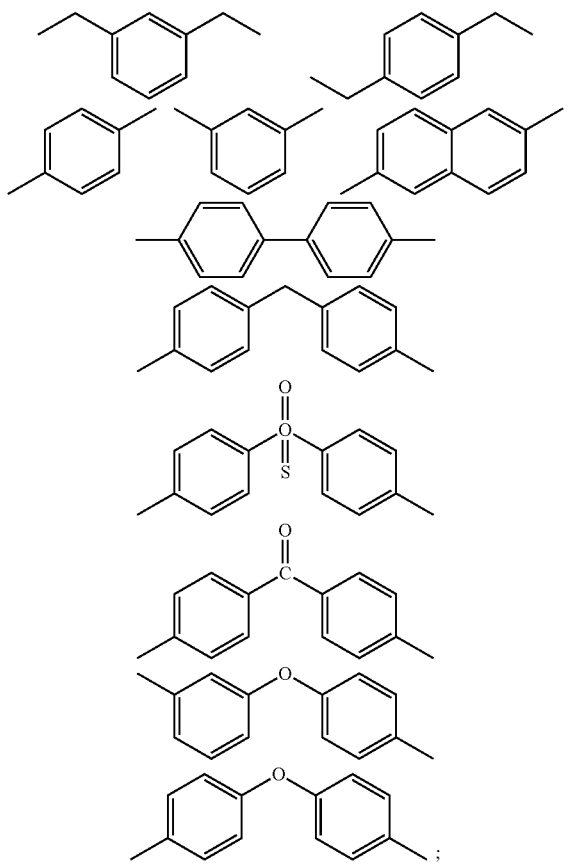

and Φ may have a main chain wherein at least one partial structure selected from the group consisting of —O—, —$SO_2$—, —CO—, —$CH_2$—, —$C(CH_3)_2$—, —$C_2H_4O$—, and —S— intervenes therein; and at least one metal layer, the white resin layer being an adhesive layer for the metal layer, wherein the at least one metal layer has a thickness of 2 to 100 μm, and the white pigment has a content of 10 to 70% by weight in the resin composition, wherein the white pigment comprises rutile titanium oxide having a surface on which a coating layer is formed, wherein the coating layer on the titanium oxide is obtained by being subjected to $SiO_2$ or $Al_2O_3$ treatment, and wherein the white pigment is particulate and has a particle diameter in a range of 0.05 to 0.43 μm.

2. A metal-clad white laminate according to claim 1, wherein the coating layer on the titanium oxide is obtained by being subjected to $SiO_2$ treatment.

3. A metal-clad white laminate according to claim 1, wherein the coating layer on the titanium oxide is obtained by being subjected to polyol or siloxane treatment after the $SiO_2$ or $Al_2O_3$ treatment.

4. A metal-clad white laminate according to claim 1, wherein the white resin layer has a thickness of 3 to 100 μm.

5. A metal-clad white laminate according to claim 1, wherein the at least one metal layer has a thickness of 5 to 100 μm.

6. A metal-clad white laminate according to claim 1, wherein Φ represents the structural unit:

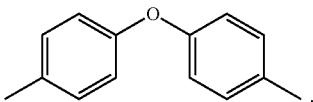

7. A metal-clad white laminate according to claim 1, wherein the polyimide has a glass transition temperature of 200 to 350° C.

8. A metal-clad white laminate according to claim 1, wherein the resin composition layer has a whiteness of 70 or more.

9. A metal-clad white laminate according to claim 1, wherein the white resin layer which is exposed by removing the metal layer has a whiteness of 60 or more after the white resin layer is irradiated with a blue light beam having a wavelength spectrum of 400 nm to 480 nm with a wavelength peak at 420 nm in air in a light strength of 90 $W/m^2$ per unit area of the white resin layer for continuously 1,000 hours.

10. A metal-clad white laminate according to claim 1, wherein the white resin layer has a reflectance of at least 50% at 410 nm to 780 nm.

11. A metal-clad white laminate according to claim 1, wherein the white resin layer is formed by:
 applying an organic solvent dispersion of the resin composition onto a metal foil which is produced in advance; and
 evaporating a solvent therefrom.

12. A metal-clad white laminate according to claim 1, wherein the white resin layer is formed by:
 superimposing a metal foil which is produced in advance on the resin composition film which is produced in advance; and
 subjecting the metal foil and the resin composition film to thermocompression bonding.

13. A printed wiring substrate comprising the metal-clad white laminate according to claim 1.

14. A printed wiring substrate according to claim 13, on which a light emitting diode is mounted.

* * * * *